US006762923B2

(12) United States Patent
Mueller-Fiedler et al.

(10) Patent No.: US 6,762,923 B2
(45) Date of Patent: Jul. 13, 2004

(54) COPLANAR SWITCH

(75) Inventors: Roland Mueller-Fiedler, Leonberg (DE); Thomas Walter, Renningen (DE); Markus Ulm, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 42 days.

(21) Appl. No.: 10/149,943

(22) PCT Filed: Oct. 11, 2001

(86) PCT No.: PCT/DE01/03905

§ 371 (c)(1),
(2), (4) Date: Aug. 27, 2002

(87) PCT Pub. No.: WO02/33777

PCT Pub. Date: Apr. 25, 2002

(65) Prior Publication Data

US 2003/0103315 A1 Jun. 5, 2003

(30) Foreign Application Priority Data

Oct. 17, 2000 (DE) ........................................ 100 51 311

(51) Int. Cl.[7] ............................ H01G 5/00; H03H 7/38
(52) U.S. Cl. .......................................... 361/277; 333/33
(58) Field of Search ................................ 361/277–279, 361/281, 287, 292; 333/33

(56) References Cited

U.S. PATENT DOCUMENTS 6,016,092 A 1/2000 Qiu et al.
6,404,304 B1 * 6/2002 Kwon et al. ................ 333/202
2002/0051334 A1 * 5/2002 Zhu et al. ................... 361/277

FOREIGN PATENT DOCUMENTS

DE 100 37 385 2/2002

OTHER PUBLICATIONS

Barket et al., "Distributed Mems Tru–Time Delay Phase Shifters and Wide–Band Switches", IEEE Transactions on Microwave Theory and Techniques, Nov. 1998, pp. 1881–1889.

* cited by examiner

*Primary Examiner*—Anthony Dinkins
*Assistant Examiner*—Eric Thomas
(74) *Attorney, Agent, or Firm*—Kenyon & Kenyon

(57) ABSTRACT

A device including a capacitor system for varying the impedance of a section of a coplanar waveguide. The capacitance of the capacitor system is variable. The capacitor system includes a first electrically conductive connection, a second electrically conductive connection, and a third electrically conductive connection at least partially. The signal line of the section of the waveguide is interrupted over a predetermined length, the first connection connecting the ground lines of the waveguide, the second connection connecting the ground lines of the waveguide, and the third connection connecting the two parts of the interrupted signal line.

12 Claims, 2 Drawing Sheets

COPLANAR SWITCH

FIELD OF THE INVENTION

The present invention relates to a device including a capacitor system for varying the impedance of a section of a coplanar waveguide.

BACKGROUND INFORMATION

German Published Patent Application No. 100 37 385 describes a device including a capacitor for varying the impedance of a section of a coplanar waveguide, in which the capacitance of the capacitor is variable and a metal bridge bridges the interrupted signal line of the waveguide over a predetermined length and is mechanically deformable as a function of an electric voltage which is applied between the metal bridge and a connection which electroconductively connects the ground lines of the waveguide, thus making it possible to initiate a switching operation. In the off-state (the metal bridge is down), a large part of the power is reflected. In the on-state (the metal bridge is up), a large part of the power is transmitted.

SUMMARY

The device according to the present invention may provide the advantage that in the on state, the insertion loss is reduced and that, at the same time, the insulation of the switch is increased in the off state. This may allow advantageous changes in the configuration of the device such as a small clearance between the bridge and the counter-electrode or a small magnetic-force stress on the dielectric. Moreover, by the additional connection between the ground lines of the waveguide, the attracting area and thereby the force pulling the bridge downward are increased as a result of which the switching voltage is reduced.

Moreover, it may be an advantage that the first, the second, and the third connections are metallic connections. In this manner, all material-specific and process-engineering advantages of using metals as electrically conductive connections are used according to the present invention.

It may also be advantageous that the third connection is mechanically deformable in such a manner that a first clearance between the first connection and the third connection as well as a second clearance between the second connection and the third connection are variable at least in a partial area of the third connection. In this manner, a capacitor system is produced with a simple arrangement whose total capacitance is variable.

Another advantage may be that the capacitance of the capacitor system is able to be changed by an electrostatic force between the first connection and the second connection on one side and the third connection on the other side. Due to this, two switching states of the device according to the present invention may be provided with a simple arrangement, ensuring a reliable and fast switching capability of the device. Moreover, the switching state of the device is unambiguously defined in this manner at all times. It is also beneficial that the capacitor system exhibits a first defined total capacitance and a second defined total capacitance as a function of a predetermined electric voltage between the first connection and the second connection on one side and the third connection on the other side. Due to this, it is possible to determine the operating frequency within wide limits independently of the spacing of the ground lines of the coplanar waveguide by the dimensioning, e.g., of the first, second and third electrically conductive connections and the dielectric layer between the first and third connections and between the second and third connections, respectively. The insertion loss may also be adjusted in this manner.

Another advantage may be that, in the case that the capacitor system exhibits the first total capacitance, the first connection forms a first inductance in series with a first partial capacitance of the capacitor system between the signal line and the ground lines, and that, in the same case, the second connection forms a second inductance in series with a second partial capacitance of the capacitor system between the signal line and the ground lines, the common impedance of the first partial capacitance and the first inductance as well as the common impedance of the second partial capacitance and the second inductance corresponding to the ohmic resistance thereof at an operating frequency. In this manner, it is possible to achieve a high insulation, i.e., a high reflection coefficient while the short-circuit switch is switched off.

Another advantage may be that the first connection and the second connection have a third clearance along the waveguide, the third clearance approximately corresponding to the equivalent of one quarter of the wavelength at an operating frequency. In this manner, the reflections at the capacitances formed by the counter-electrodes, i.e., the first and second connections, with the bridge, i.e., the third connection, compensate each other in the switched-on state, that is, in the case that the capacitor system exhibits the second total capacitance. In this manner, the adaptation of the switch structure is considerably improved, that is, the insertion loss is reduced.

It is also beneficial that an operating frequency of approximately 77 GHz or approximately 24 GHz is provided. Due to this, the device according to the present invention is suitable for ACC applications (Adaptive Cruise Control) or for SRR applications (Short Range Radar).

It may be a further advantage that the predetermined length is provided such that reflections at a transition between the signal line and the second connection compensate each other. This results in an improvement of the insertion loss of the switch and thereby of the adaptation in the switched-on state.

Another advantage may be that the ground lines of the waveguide are connected by more than two connections over the predetermined length. In this manner, it is possible, on one hand, to further reduce the switching voltage; on the other hand, to once more increase the insulation in the switched-off state, and to reduce the insertion loss in the switched-on state.

It is also expedient that the number of connections connecting the ground lines of the waveguide is odd. In this manner, the switching voltage may be reduced once more since it is possible to provide a connection connecting the ground lines in the middle of the length where the greatest deflection may be achieved with a given force or the smallest force is required for a predefined deflection.

An example embodiment of the present invention is depicted in the drawing and will be explained in greater detail in the following description.

DETAILED DESCRIPTION

Figures 1, 2A, 2B, 3, 4:
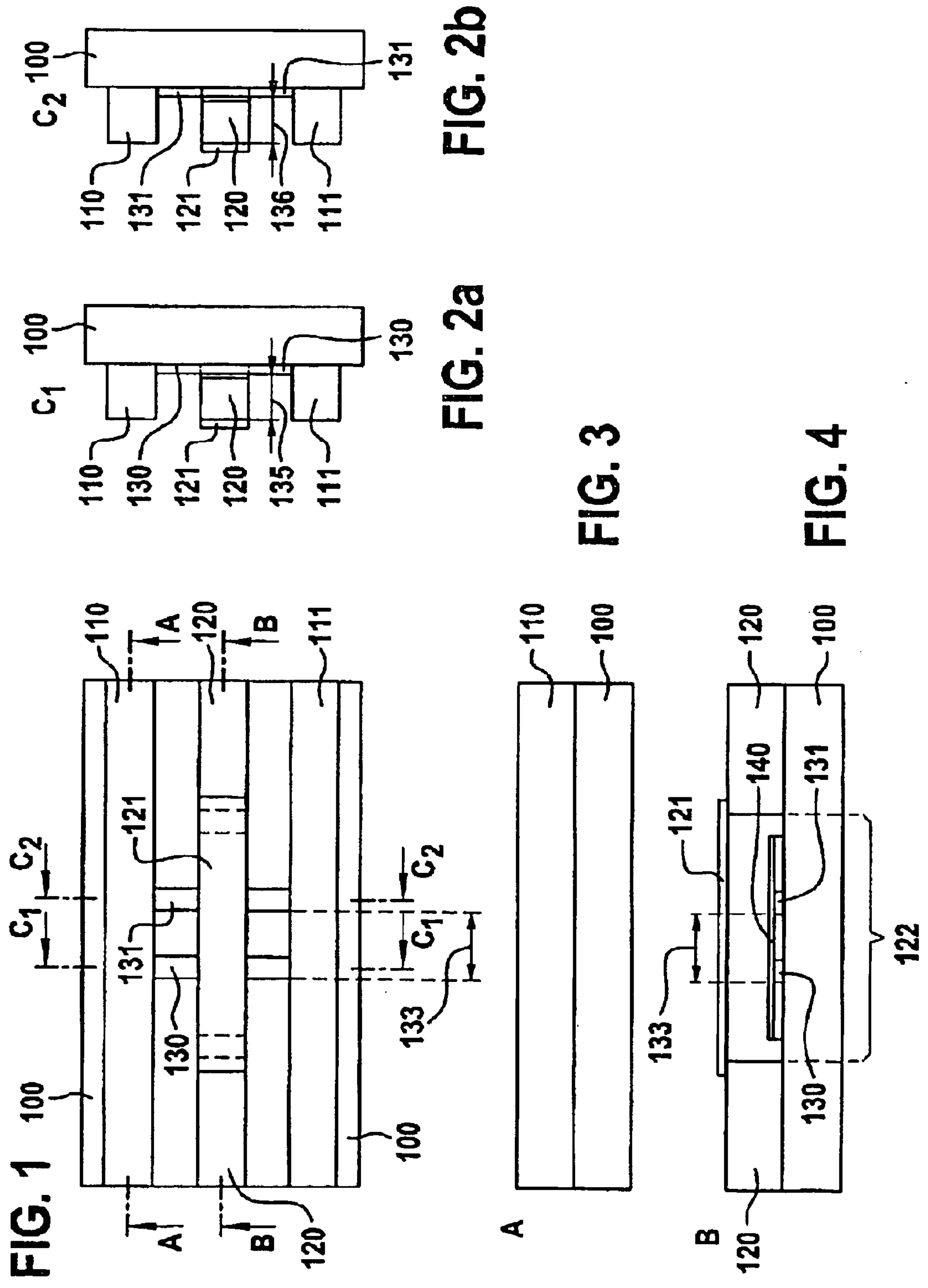
FIG. 1 is a top view of a device including a capacitor system according to the present invention, provision is made for lines of intersection A, B, C1 and C2.
FIG. 2*a* shows the device according to the present invention in a sectional view along line of intersection C1.
FIG. 2*b* shows the device according to the present invention in a sectional view along line of intersection C2.
FIG. 3 shows the device according to the present invention in a sectional view along line of intersection A.
FIG. 4 shows the device according to the present invention in a sectional view along line of intersection B.

FIG. 1 shows a micromechanical high-frequency short circuit switch as an example of a device including a capacitor system according to the present invention. In the device according to the present invention, a coplanar waveguide is applied to a substrate 100. According to the present invention, the coplanar waveguide is constituted, e.g., by three coplanar electrically conductive lines which are guided parallel to each other at least locally. The conductors of the coplanar waveguide are provided, e.g., in metallic form and deposited on substrate 100, e.g., using one or a plurality of galvanic process steps. According to the present invention, substrate 100 has the property of having a small loss angle. The two outer of the three conductors of the coplanar waveguide correspond to a first ground line 110 and a second ground line 111, and the middle conductor corresponds to a signal line 120 of the coplanar waveguide. FIG. 1 is a top view of a segment of such a coplanar waveguide arranged on substrate 100, the section is of interest for the device according to the present invention. The two ground lines 110, 111 of the coplanar waveguide are connected via a first electrically conductive connection 130 and via a second electrically conductive connection 131. In this connection, both first connection 130 and second connection 131 are, for example, directly applied to substrate 100 and have a small "height" compared to the "height" of ground lines 110, 111, that is, first connection 130 and second connection 131 connect ground lines 110, 111 at their "foot" on substrate 100. In the region of first connection 130 and second connection 131, signal line 120 of the coplanar waveguide is interrupted. Therefore, in fact, first connection 130 and second connection 131 are not electroconductively connected to signal line 120. According to the present invention, a layer of a dielectric is applied to first connection 130 and to second connection 131 in the region of the interruption of signal line 120. In this context, the application surface of the dielectric may be continuous for first connection 130 and second connection 131 or else, be interrupted so as to provide a separate surface of dielectric both for first connection 130 and for second connection 131, respectively. Moreover, interrupted signal line 120 is connected via a third electrically conductive connection 121. According to the present invention, third connection 121 is provided here in the form of a metallic bridge between the ends of interrupted signal line 120. According to the present invention, however, third connection 121 is provided at a certain distance from the plane of substrate 100, the distance of third connection 121 from substrate 100 or from first connection 130 or from second connection 131 corresponding approximately to the height of signal line 120. Due to this, third connection 121 "floats" between the ends of interrupted signal line 120 in the absence of forces. Therefore, third connection 121 is also denoted as bridge or metal bridge 121. Also shown in FIG. 1 are a first line of intersection denoted by letter C1, a second line of intersection denoted by letter C2, a third line of intersection denoted by letter A, and a fourth line of intersection denoted by letter B. First line of intersection C1 intersects the device according to the present invention in a direction perpendicular to the extension of ground lines 110, 111 and of signal line 120 in the region of first connection 130. Second line of intersection C2 intersects the device according to the present invention in a direction perpendicular to the extension of ground lines 110, 111 and of signal line 120 in the region of second connection 131. Third line of intersection A intersects the device according to the present invention in a direction parallel to the extension of conductors 110, 111, 120 of the coplanar waveguide in the region of first ground line 110. Fourth line of intersection B intersects the device according to the present invention in a direction parallel to the extension of conductors 110, 111, 120 of the coplanar waveguide in the region of signal line 120 i.e., where signal line 120 is interrupted, in the region of third connection 121. Moreover, FIG. 1 depicts first connection 130 at a distance from second connection 131. This distance between first connection 130 and second connection 131 is also referred to as third clearance 133. According to the present invention, third clearance 133 corresponds, for example, more or less to the equivalent of one quarter of the wavelength at the operating frequency.

FIG. 2*a* shows the device according to the present invention in a sectional view along first line of intersection C1. Again, substrate 100, first ground line 110 and second ground line 111 of the coplanar waveguide are shown. Signal line 120 of the waveguide is arranged between ground lines 110, 111 of the coplanar waveguide. In FIG. 2*a*, the spatial arrangement of first connection 130 and of third connection 121 becomes clear with regard to their distance from the surface of substrate 100. In FIG. 2*a*, first connection 130 is directly applied to substrate 100 while third connection 121 is applied to signal line 120 and provided such that, if no forces act upon third connection 121, it is spaced from the plane of substrate 100 by the height of signal or ground lines 110, 111, 120. The clearance between third connection 121 and first connection 130 shown in FIG. 2*a* is provided with reference numeral 135 and is also denoted as first clearance 135.

FIG. 2*b* shows the device according to the present invention in a sectional view along second line of intersection C2. FIG. 2*b* completely corresponds to FIG. 2*a* except for the difference that in FIG. 2*b*, first connection 130 which is known from FIG. 2*a* is replaced with second connection 131. Accordingly, first clearance 135 is replaced with second clearance 136, second clearance 136 denoting the clearance between third connection 121 and second connection 131.

In FIG. 3, the device according to the present invention is shown in a sectional view along third line of intersection A. Only substrate 100 and first ground line 110 are visible.

In FIG. 4, the device according to the present invention is shown in a sectional view along fourth line of intersection B. Signal line 120 of the coplanar waveguide is provided on substrate 100. Signal line 120 is interrupted over a predetermined length 122. In this region, signal line 120 is bridged by third connection 121. In this connection, third connection 121 connects the two ends of signal line 120 resulting from the interruption of signal line 120. In FIG. 4, third connection 121 is shown at a distance from substrate 100 which corresponds to the height of signal line 120. Moreover, FIG. 4 depicts first connection 130 and second connection 131. Located above first connection 130 and second connection 131 is dielectric layer 140 which has already been mentioned in connection with FIG. 1 and which, in FIG. 4, is provided for both first connection 130 and second connection 131 as a common dielectric layer 140.

Figure 5:
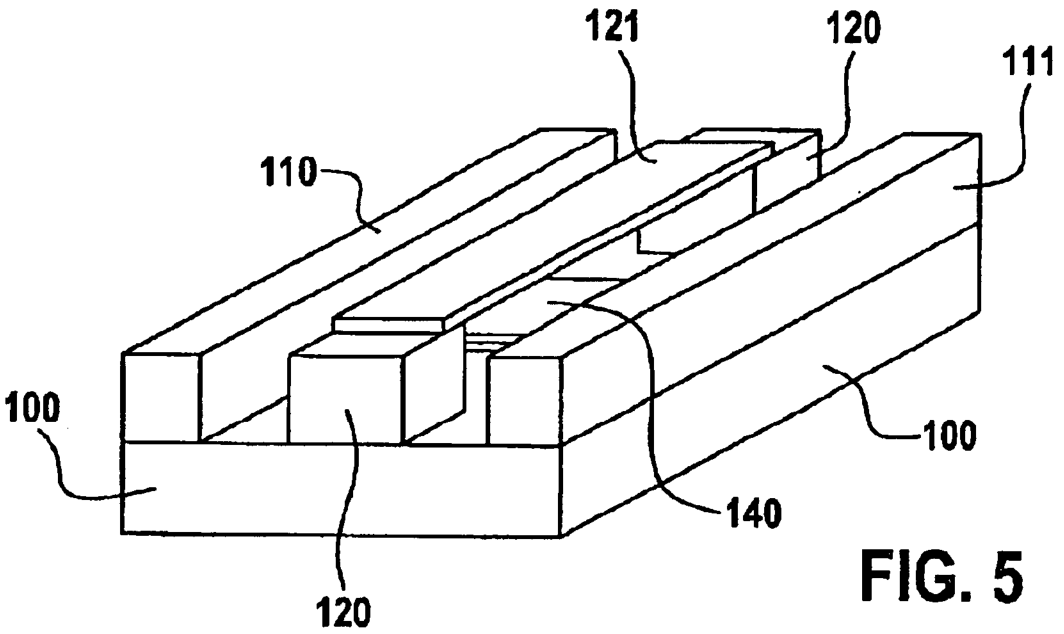
FIG. 5 is a perspective view of the device according to the present invention.

FIG. 5 is a perspective view of the device according to the present invention. First ground line 110 and second ground line 111 of the waveguide are located on substrate 100. Interrupted signal line 120 is situated between these ground lines 110, 111. The two ends of signal line 120 are bridged by third connection 121. Also shown in FIG. 5 is dielectric layer 140. First and second connections 130, 131 are provided between ground lines 110, 111 below dielectric layer 140, i.e., in a direction toward substrate 100.

Figure 6:
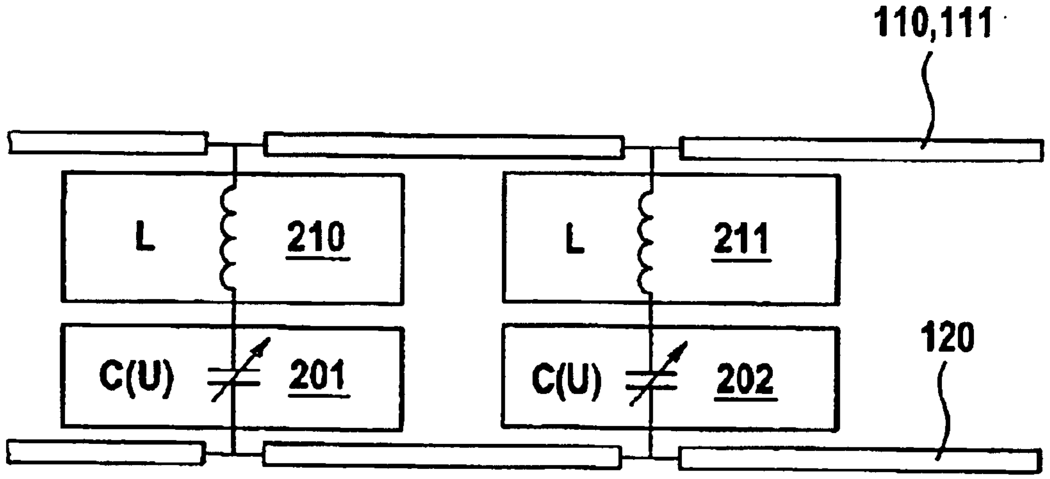
FIG. 6 shows an equivalent circuit diagram of the device according to the present invention.

FIG. 6 shows an equivalent circuit diagram of the system according to the present invention. In the equivalent circuit diagram, the two ground lines 110, 111 are represented only in the form of a single line of the coplanar waveguide. This is because ground lines 110, 111 are at the same potential. Also shown in FIG. 6 is signal line 120 of the coplanar waveguide. A first impedance and a second impedance are arranged parallel to each other between signal line 120 and ground lines 110, 111. The first impedance includes a first partial capacitance 201 and a first inductance 210 in series. The second impedance includes a second partial capacitance 202 and a second inductance 211 in series. The two impedances together form capacitor system 200. First partial capacitance 201 is implemented, at least partially, by first connection 130 and third connection 121. Second partial capacitance 202 is implemented, at least partially, by second connection 131 and third connection 121. The two partial capacitances 201, 202 are configured to be variable, namely, according to the present invention, in that third connection 121 mechanically deforms, thus changing its distance from first connection 130 and from second connection 131, respectively, which influences partial capacitances 201, 202. First inductance 210 is implemented by-first connection 130, and second inductance 211 is implemented by second connection 131. First and second inductances 210, 211 are produced through the structuring of first connection 130 and second connection 131, which each act as DC short circuit between ground lines 110, 111, it is possible for the inductances to be predetermined by changing the length/width ratio, the shape, for example, meander-shaped or the like.

In FIGS. 4 and 5, mechanically deformable third connection 121 is shown for the case that the shown section of the coplanar waveguide has a high transmission coefficient and a low reflection coefficient. The clearance of first connection 130 and second connection 131 on one side and of third connection 121 one the other side, which, together with the electrical properties of dielectric layer 140, decisively determines the capacitance of capacitor system 200, is shown in FIG. 4 with maximum distance. In this case, the capacitance of capacitor system 200 is very small and decisive for the input loss, for example, of a short-circuit switch. In the case that an electric voltage, for example, a DC voltage, is applied between first connection 130 and second connection 131 on one side and third connection 121 on the other side, an electrostatic force of attraction arises between first connection 130 or second connection 131 and third connection 121. This results in that third connection 121 deforms since it is mechanically deformable and in that, at least in a partial area, namely in the middle of metal bridge 121, it is pulled toward first and second connections 130, 131 or toward dielectric layer 140 which is applied to first and second connections 130, 131, respectively. The dielectric, e.g., silicon dioxide or silicon nitride, prevents galvanic contact of the device, which is configured, as a switch, while it is in this switched-off state. Due to this, partial capacitances 201 and 202 change in such a manner that the capacitance of capacitor system 200 is increased. According to the present invention, therefore, the capacitance of capacitor system 200 is changed and the device, when configured as a switch, is switched by applying or removing an electric voltage between first and second connections 130, 131 on one side and third connection 121 on the other side. The position of third connection 121 shown in FIGS. 4 and 5 corresponds to the operation of the device which permits passage and is referred to as switched-on state. The state where third connection 121 is pulled toward first and second 130, 131 by an electric voltage corresponds to a disabled switch. This is the case because, according to the present invention, provision is made for the waveguide, which includes the section shown in FIGS. 1 through 4, to be operated at a predetermined operating frequency. Depending on an electric voltage between first and second connections 130, 131 on one side and third connection 121 on the other side, the capacitance of capacitor system 200 takes on two capacitance values which will be referred to as first total capacitance and as second total capacitance hereinafter. The first total capacitance corresponds to the switched-off state, that is, third connection 121 is pulled toward first or second connections 130, 131 due to the applied electrical voltage. Consequently, the second total capacitance corresponds to the ON case in which third connection 121 is not mechanically deformed. According to the present invention, the first total capacitance and the second total capacitance are determined by variation of the width and length of first and second connections 130, 131 and of third connection 121 as well as of the thickness and material properties of dielectric layer 140 and of the height of signal line 120. According to the present invention, provision is made for connections 130, 131, 121, for dielectric layer 140 and for signal line 120 to be sized such that the first impedance is just canceled out or becomes as small as possible at the operating frequency and in the switched-off state of the device according to the present invention. According to the present invention, first inductance 210 is adjusted mainly by the sizing and shaping of first connection 130 between ground lines 110, 111 of the waveguide. The equivalent applies to the second impedance; here, however, the shaping of second connection 131 is decisive for second inductance 211.

According to the present invention, third connection 121 is a thin metal bridge 121 suspended between the ends of interrupted signal line 120 of the waveguide. First and second connections 130, 131 act as DC short circuits between ground lines 110, 111. First partial capacitance 201 is formed by first connection 130 together with third connection 121, and second partial capacitance 202 is formed by second connection 131 together with third connection 121. By first inductance 210 in series with first partial capacitance 201 as well as second inductance 211 in series with second partial capacitance 202, in each case, a series resonant circuit is formed whose resonant frequency in the switched-off state of third connection 121 lies at the operating frequency of the device by suitable dimensioning of inductances 210, 211 and of partial capacitances 201, 202. In this manner, the impedance between signal line 120 and ground lines 110, 111 is strongly reduced compared to the pure partial capacitances (without inductances), as a result of which the insulation of a device which is configured as a high frequency switch is considerably improved. The insulation is now limited by the ohmic losses in first and second connections 130, 131, respectively. In the switched-on state, the device or the assembly or component is operated outside of this resonant frequency at the operating frequency due to the in each case reduced partial capacitances 201, 202 (metal bridge 121 is "up"), so that no increase in insertion loss results. If the length of third connection 121 is suitably sized, for example, to be half of the effective wavelength at the operating frequency, the reflections at the joints or transition points between coplanar waveguide (that is, the ends of signal line 120) and third connection 121 compensate each other, as a result of which the insertion loss of the device, which is configured, for example, as a switch and thus, the adaptation are improved. This corresponds to a transformation of the impedance of third connection 121 to the impedance of the coplanar waveguide. The length of third connection 121 is not limited by a maximum clearance of the ground lines at high operating frequencies. Thus, at higher operating frequencies, no increased switching voltage, i.e., voltage to be applied between first and second connections 130, 131 on one side and third connection 121 on the other side, needs to be used.

According to the present invention, provision is made for the operating frequency to be selectable in the range of approximately 77 GHz or approximately 24 GHz. In this manner, the device according to the present invention is suitable in the field of ACC (Adaptive Cruise Control) or SRR (Short Range Radar).

According to the present invention, third clearance 133 is selected such that the insertion loss is as low as possible. When third clearance 133 is selected to be about one quarter of the effective wavelength (at the operating frequency), the reflections at the capacitances formed by the counter-electrodes, i.e., first connection 130 and second connection 131, with the bridge, i.e., third connection 121, compensate each other in the switched-on state, that is, the adaptation of the switch structure is considerably improved.

According to the present invention, provision is also made to provide more than two connections between ground lines 110, 111 of the waveguide. In this connection, it may be advantage for such a number to be odd because then, such a connection may also be provided in the middle between ground lines 110, 111 of the waveguide where metal bridge 121 may be deflected most easily.

What is claimed is:

1. A device, comprising:

a capacitor system having a capacitance that is variable and for varying an impedance of a section of a coplanar waveguide, the capacitor system including:
 a first electrically conductive connection,
 a second electrically conductive connection, and
 a third electrically conductive connection;

wherein a signal line of the section of the coplanar waveguide is interrupted over a predetermined length; and wherein the first electrically conductive connection connects ground lines of the coplanar waveguide, the second electrically conductive connection connects the ground lines of the coplanar waveguide, and the third electrically conductive connection connects a first part and a second part of the interrupted signal line.

2. The device according to claim 1, wherein:

the first electrically conductive connection, the second electrically conductive connection, and the third electrically conductive connection are metallic connections.

3. The device according to claim 1, wherein:

the third electrically conductive connection is mechanically deformable in such a manner that a first clearance between the first electrically conductive connection and the third electrically conductive connection as well as a second clearance between the second electrically conductive connection and the third electrically conductive connection are variable at least in a partial area of the third electrically conductive connection.

4. The device according to claim 1, wherein:

the capacitance of the capacitor system is able to be changed by an electrostatic force between the first electrically conductive connection and the second electrically conductive connection on a first side and the third electrically conductive connection on a second side.

5. The device according to claim 1, wherein:

the capacitor system exhibits a first defined total capacitance and a second defined total capacitance as a function of a predetermined electric voltage between the first electrically conductive connection and the second electrically conductive connection on a first side and the third electrically conductive connection on a second side.

6. The device according to claim 5, wherein if the capacitor system exhibits the first defined total capacitance:

the first electrically conductive connection forms a first inductance in series with a first partial capacitance of the capacitor system between the interrupted signal line and the ground lines;

the second electrically conductive connection forms a second inductance in series with a second partial capacitance of the capacitor system between the interrupted signal line and the ground lines; and a common impedance of the first partial capacitance and the first inductance as well as a common impedance of the second partial capacitance and the second inductance corresponds to an ohmic resistance thereof at an operating frequency.

7. The device according to claim 6, wherein:

the operating frequency is one of approximately 77 GHz and approximately 24 GHz.

8. The device according to claim 1, wherein:

the first electrically conductive connection and the second electrically conductive connection have a third clearance along the coplanar waveguide, the third clearance corresponding to an equivalent of one quarter of a wavelength at an operating frequency.

9. The device according to claim 8, wherein:

the operating frequency is one of approximately 77 GHz and approximately 24 GHz.

10. The device according to claim 1, wherein:

the predetermined length is provided such that reflections at a transition between the interrupted signal line and the second electrically conductive connection compensate each other.

11. The device according to claim 1, wherein:

the ground lines of the coplanar waveguide are connected by more than two connections over the predetermined length.

12. The device according to claim 11, wherein:

the number of connections connecting ground lines of the coplanar waveguide is odd.

* * * * *